United States Patent
Yang et al.

(10) Patent No.: US 7,116,566 B2
(45) Date of Patent: Oct. 3, 2006

(54) METHOD AND CIRCUIT FOR CONTROLLING SWITCHING FREQUENCY SIGNAL

(75) Inventors: Pei Pei Yang, Hsinchu (TW); Darcherng Su, Taipei (TW); Ko-Chin Wang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 788 days.

(21) Appl. No.: 10/271,337

(22) Filed: Oct. 15, 2002

(65) Prior Publication Data

US 2003/0076880 A1    Apr. 24, 2003

(30) Foreign Application Priority Data

Oct. 15, 2001    (TW)    ................. 90125462 A

(51) Int. Cl.
    *H02M 1/12*    (2006.01)
(52) U.S. Cl. ................. 363/41; 363/16; 323/283
(58) Field of Classification Search ............. 363/21.06, 363/89, 21.4, 44, 84, 41, 95; 323/282–286; 455/92, 115; 330/51, 129
See application file for complete search history.

(56) References Cited

U.S. PATENT DOCUMENTS 5,594,631 A * 1/1997 Katoozi et al. ............... 363/41
5,920,596 A * 7/1999 Pan et al. .................... 375/238

* cited by examiner

*Primary Examiner*—Rajnikant B. Patel
(74) *Attorney, Agent, or Firm*—Knoble Yoshida & Dunleavy, LLC

(57) ABSTRACT

A method and a circuit for controlling a switching frequency signal used in a direct current to direct current (DC to DC) converter are proposed. The DC to DC converter generates an output voltage to drive a system. The switching frequency signal is generated by inputting a modulation frequency to a pulse width modulation (PWM) circuit. The method includes steps of: 1. generating a control signal from the system to stop the pulse width modulation (PWM) circuit to generate the switching frequency signal when a signal is received by the system; and 2. restarting the pulse width modulation (PWM) circuit to generate the switching frequency signal in order to increase the output voltage to drive the system when the output voltage from the DC to DC converter is under a predetermined voltage.

13 Claims, 5 Drawing Sheets

METHOD AND CIRCUIT FOR CONTROLLING SWITCHING FREQUENCY SIGNAL

FIELD OF THE INVENTION

The present invention is related to a method and a circuit for controlling a switching frequency signal, and more particularly for controlling a switching frequency signal used in a direct current to direct current (DC to DC) converter.

BACKGROUND OF THE INVENTION

The traditional DC to DC Converter is applied to adjust the voltage level of the DC input voltage to stabilize the output voltage at a pre-determined value.

Please refer to FIG. 1, it is a block diagram showing the circuit configuration of the prior art of the present invention. Mainly, this circuit configuration is used to offer a constant frequency from a resistance-capacitance oscillator (RCO) 10 to a pulse width modulation (PWM) circuit 11 to engage in the modulation. Thus, a switching frequency signal $F_p$ is generated to control a controllable switch 12 which is made of an n-type metal-oxide-semiconductor transistor (NMOS) to maintain the output voltage at a certain value.

The method to control the switch frequency signal $F_p$ is as follows:

1. When the $F_p$ is at the high level, the switch 12 is conducted. Through the inductor L, the input current $I_L$ flows through NMOS, then $I_L$ is grounded. Thus, the diode D is reverse-biased, and an output current is offered by the capacitor C onto the load $R_L$.

2. When $F_p$ is at the low level, the controllable switch 12 is closed. The inductor L will change the direction of the magnetic field thus making the positive pole and negative pole of the inductor to switch. This will cause the diode D to be forward-biased, and make the energy store in the inductor to produce an output current. Through the diode D, the output current is offered onto the load $R_L$.

Please refer to FIG. 2, which is a plot showing that through the switching frequency signal $F_p$ to control the controllable switch 12 will cause the variance of the current flowing through the inductor. It can be seen from the plot, when $F_p$ is at the high level, the inductor L is in the charging status thus the current $I^L$ will keep on increasing. When $F_p$ is at the low level, the energy stored in the inductor L will produce an output current onto the load $R_L$ thus the current $I^L$ will keep on decreasing.

Since the current flowing through the inductor is changing, this will make the inductor to produce a magnetic field. In the application of the wireless communication system, this magnetic field will interfere with the reception of the Radio Frequency (RF), and cause the deteriorating of the sensitivity of the receiving signals or the receiving information.

Keep the drawbacks of the prior art in mind, and employ experiments and research full-heartily and persistently, the method and the circuit for controlling switching signals are finally conceived by the applicants.

SUMMARY OF THE INVENTION

It is therefore an object of the present invention to propose a method for controlling a switching frequency signal used in a direct current to direct current (DC to DC) converter.

It is therefore another object of the present invention to propose a circuit for controlling a switching frequency signal used in a direct current to direct current (DC to DC) converter.

According to the aspect of the present invention, the DC to DC converter generates an output voltage to drive a system, and a switching frequency signal is generated by inputting a modulation frequency to a pulse width modulation (PWM) circuit. The method includes steps of:

1. generating a control signal from the system to stop the pulse width modulation (PWM) circuit to generate the switching frequency signal when a signal is received by the system; and
2. restarting the pulse width modulation (PWM) circuit to generate the switching frequency signal in order to increase the output voltage to drive the system when the output voltage from the DC to DC converter is under a predetermined voltage.

Certainly, the system can be a wireless communication system.

Preferably, the signal is received by a radio frequency (RF) receiver of the wireless communication system.

Preferably, the switching frequency signal is used for switching a switch.

Certainly, the switch can be an N type metal-oxide-semiconductor transistor (NMOS).

Preferably, the predetermined voltage is set by the system.

Preferably, the modulation frequency is a constant frequency.

According to the aspect of the present invention, the DC to DC converter generates an output voltage to drive a system. A switching frequency signal is generated by inputting a modulation frequency to a pulse width modulation (PWM) circuit. The circuit for controlling the switching frequency signal includes a plurality of comparative circuits having a plurality of corresponding predetermined voltages for comparing the output voltage and the plurality of corresponding predetermined voltages. When a signal is received by the system to stop the switching frequency signal and the output voltage is smaller than the plurality of corresponding predetermined voltages, a plurality of output signals is generated. The circuit for controlling the switching frequency signal also includes a multiplexer electrically connected to the plurality of comparative circuits for determining one of the plurality of comparative circuits according to the system. The multiplexer transfers one of the plurality of output signals corresponding to the determined comparative circuit to the pulse width modulation (PWM) circuit for restarting the PWM circuit to generate the switching frequency signal, thereby increasing the output voltage to drive the system.

Preferably, the switching frequency signal is used for switching a switch.

Certainly, the switch can be an N type metal-oxide-semiconductor transistor (NMOS).

Certainly, the system can be a wireless communication system.

Preferably, the signal is received by a radio frequency (RF) receiver of the wireless communication system.

According to the aspect of the present invention, the DC to DC converter generates an output voltage to drive a system. A switching frequency signal is generated by inputting a modulation frequency to a pulse width modulation (PWM) circuit. The circuit for controlling the switching frequency signal includes the comparative circuit having a predetermined voltage for comparing the output voltage and the predetermined voltage. When a signal is received by the

DETAILED DESCRIPTION OF THE PREFERRED EMBODIMENT

Figure 1:
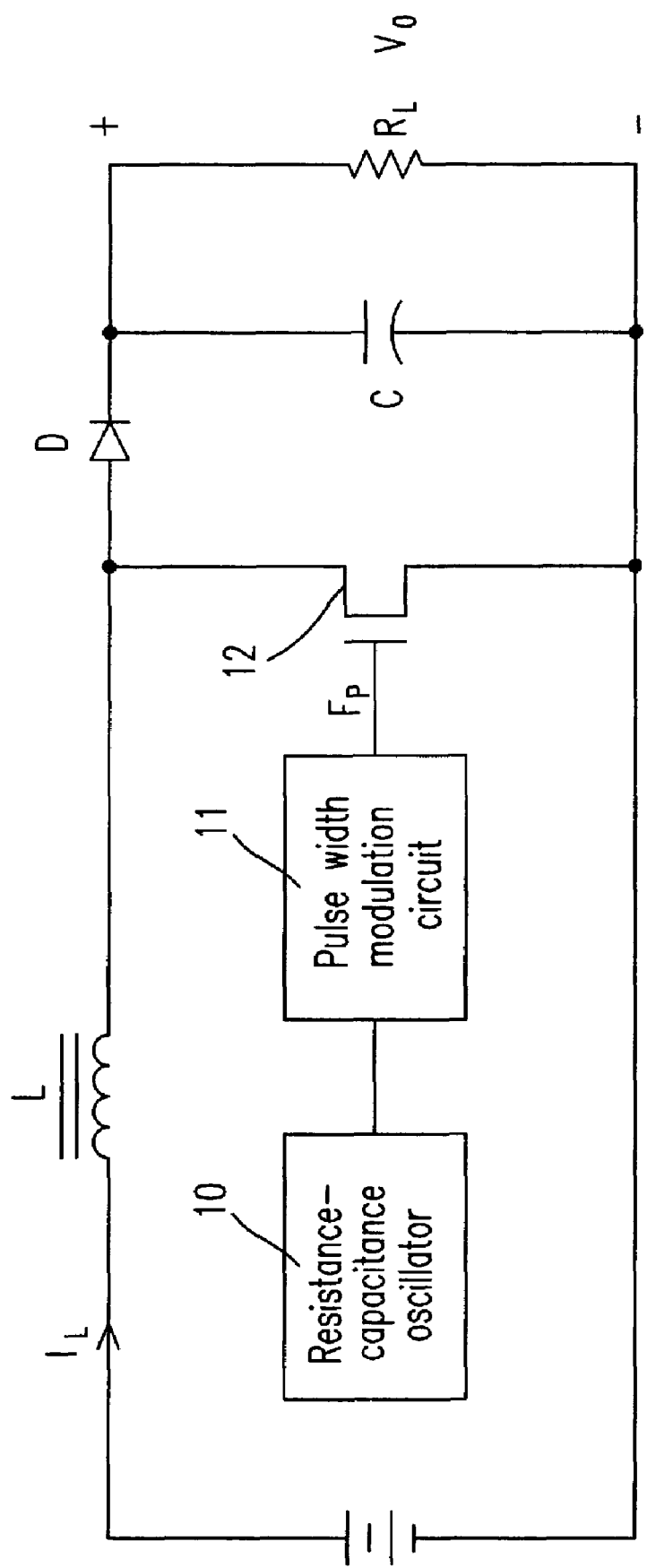
FIG. 1 is a block diagram showing the circuit configuration of the prior art of the present invention.
Figure 2:
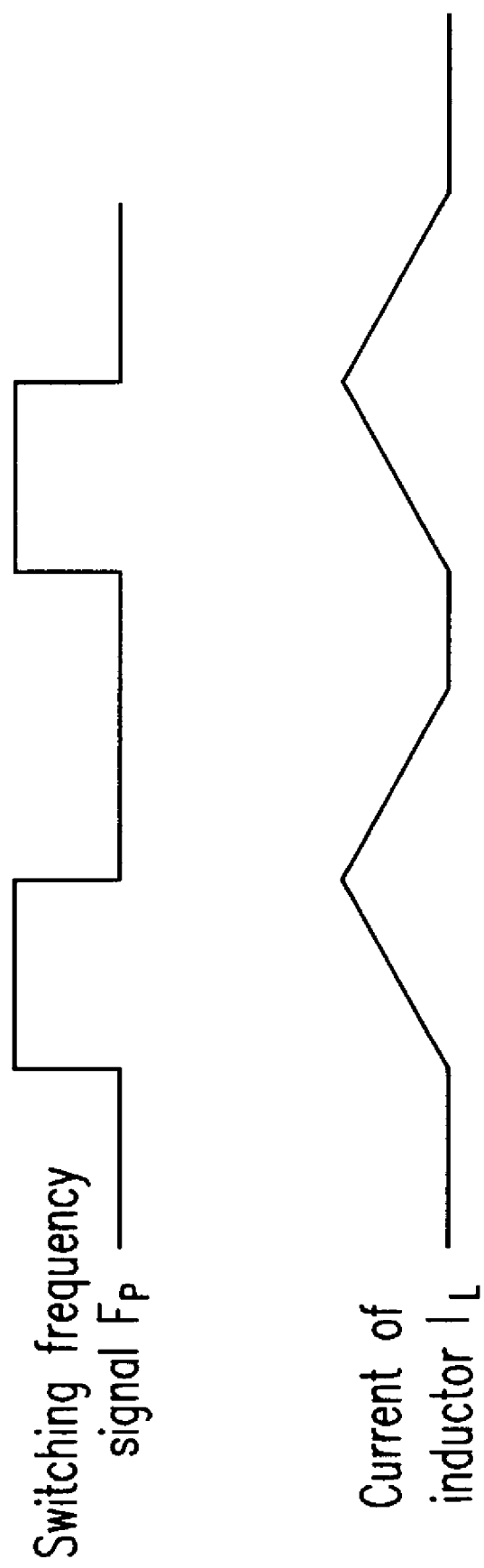
FIG. 2 is a plot of the prior art of the present invention showing that the switching frequency signal will cause the variance of the current flowing through the inductor of the prior art.
Figure 3:
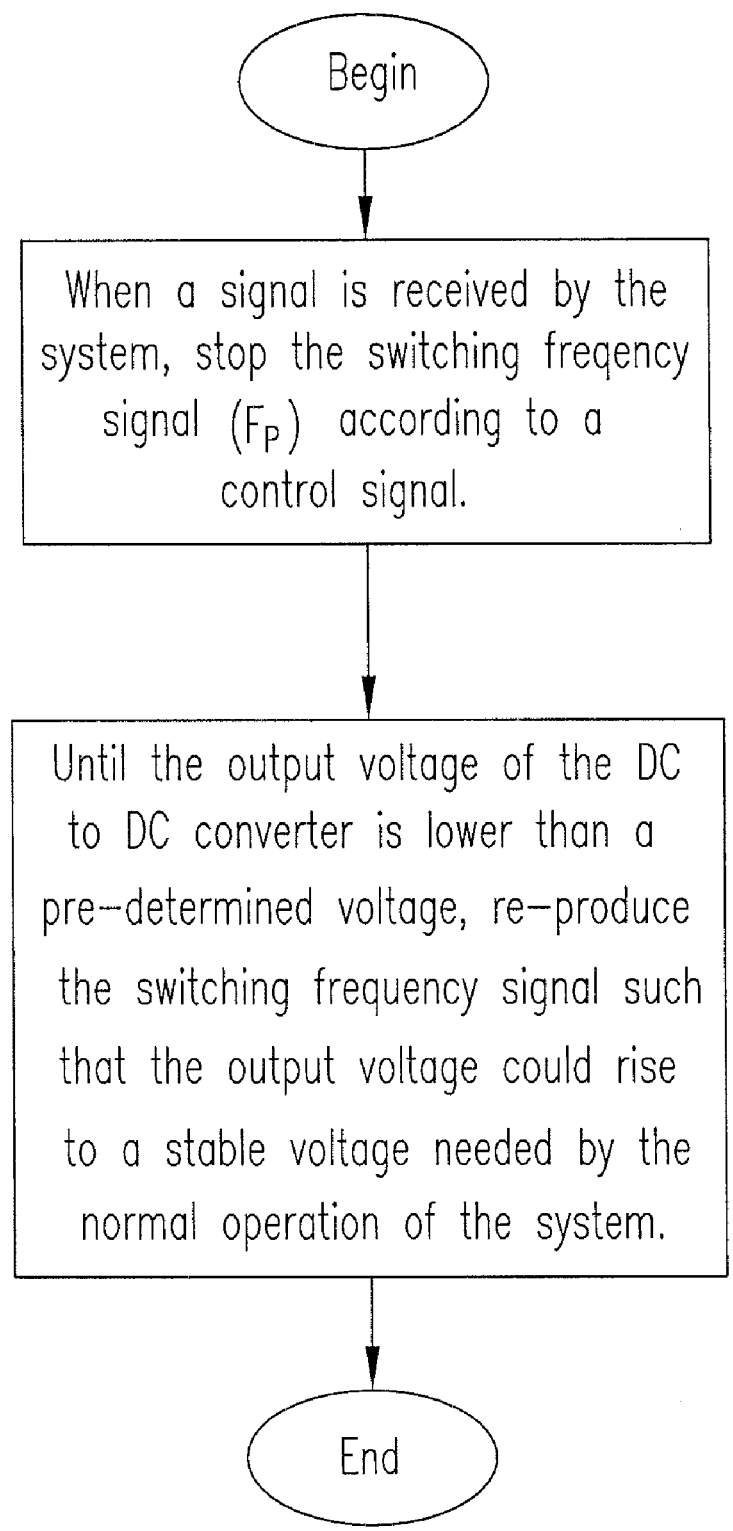
FIG. 3 is a flow chart showing the method for controlling the switching frequency signal of the present invention.

Please refer to FIG. 3, which is a flow chart showing the method for controlling the switching frequency signal of the present invention. It is mainly applied to a DC to DC converter. This DC to DC converter can produce an output voltage to offer a voltage to drive a wireless communication system to operate normally. The switching signal $F_p$ is a signal resulting from inputting a modulation signal to a pulse width modulation circuit to engage in the modulation. This signal is used to control the switching of a controllable switch. The steps are described as follows.

1. If the wireless communication system is operating normally, and a signal is received from the radio frequency receiver of the wireless communication system, then the wireless communication system will produce a control signal. Thus, the pulse width modulation circuit will stop to produce the switching frequency signal such that the system could avoid the interference while receiving this signal.
2. Until the output voltage of the DC to DC converter is lower than a pre-determined voltage, re-drive the pulse width modulation circuit to produce the switching frequency signal such that the output voltage could rise to a stable voltage needed by the normal operation of the system.

Using this method will keep the wireless communication system from being interfered while receiving a signal.

Figure 4:
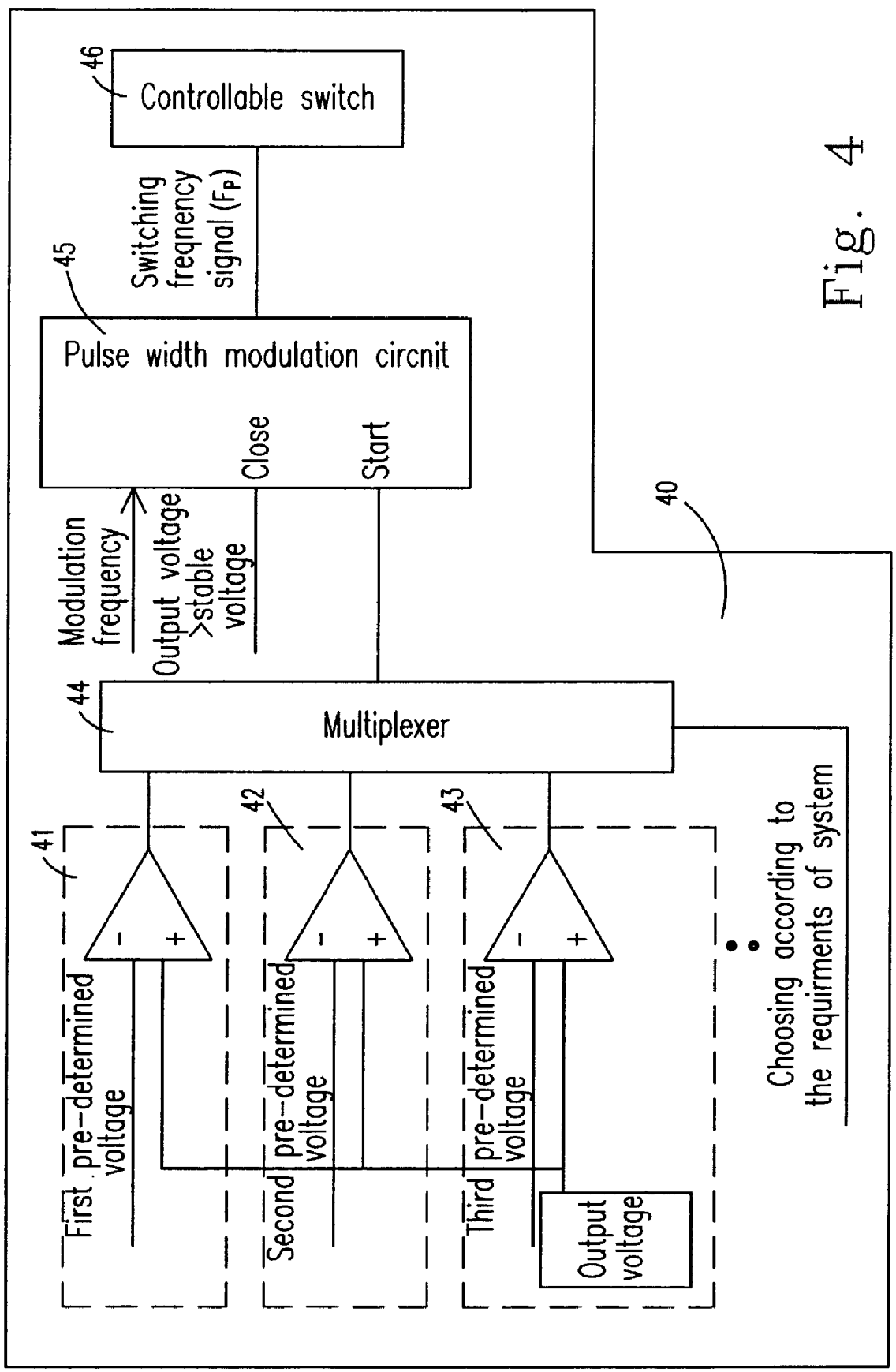
FIG. 4 is a block diagram showing the circuit configuration for controlling the switching frequency signal of the present invention.

Please refer to FIG. 4, which is a block diagram showing the circuit configuration for controlling the switching frequency signal. Since the circuit configuration could include a plurality of comparative circuits, therefore, the preferred embodiment is described in detail under the circumstance of having three comparative circuits. The circuit configuration includes a first comparative circuit 41, a second comparative circuit 42, a third comparative circuit 43, and a multiplexer 44.

There is a first pre-determined voltage in the first comparative circuit 41, a second pre-determined voltage in the second comparative circuit 42, and a third pre-determined voltage in the third comparative circuit 43 respectively. These pre-determined voltages are used when the pulse width modulation circuit 45 stops to produce the switching frequency signal and the radio frequency receiver of the wireless communication system is trying to receive a signal. The first, second, and the third pre-determined voltages are compared with the output voltage of the DC to DC converter. If the output voltage is less than those pre-determined voltages, then three output signals will be produced. The multiplexer 44, electrically connected to those comparative circuits, chooses a needed comparative circuit from the plurality of the comparative circuits according to the requirements of the system. The corresponding output voltage will be transmitted to the pulse width modulation circuit 45 to produce the switching frequency $F_p$ to control turning on and off the controllable switch 46. This will result in the output voltage of the DC to DC converter 40 rising to the stabilized voltage required by the normal operation of the wireless communication system. The controllable switch 46 preferably is a NMOS, and the modulation frequency is a constant frequency.

Figure 5:
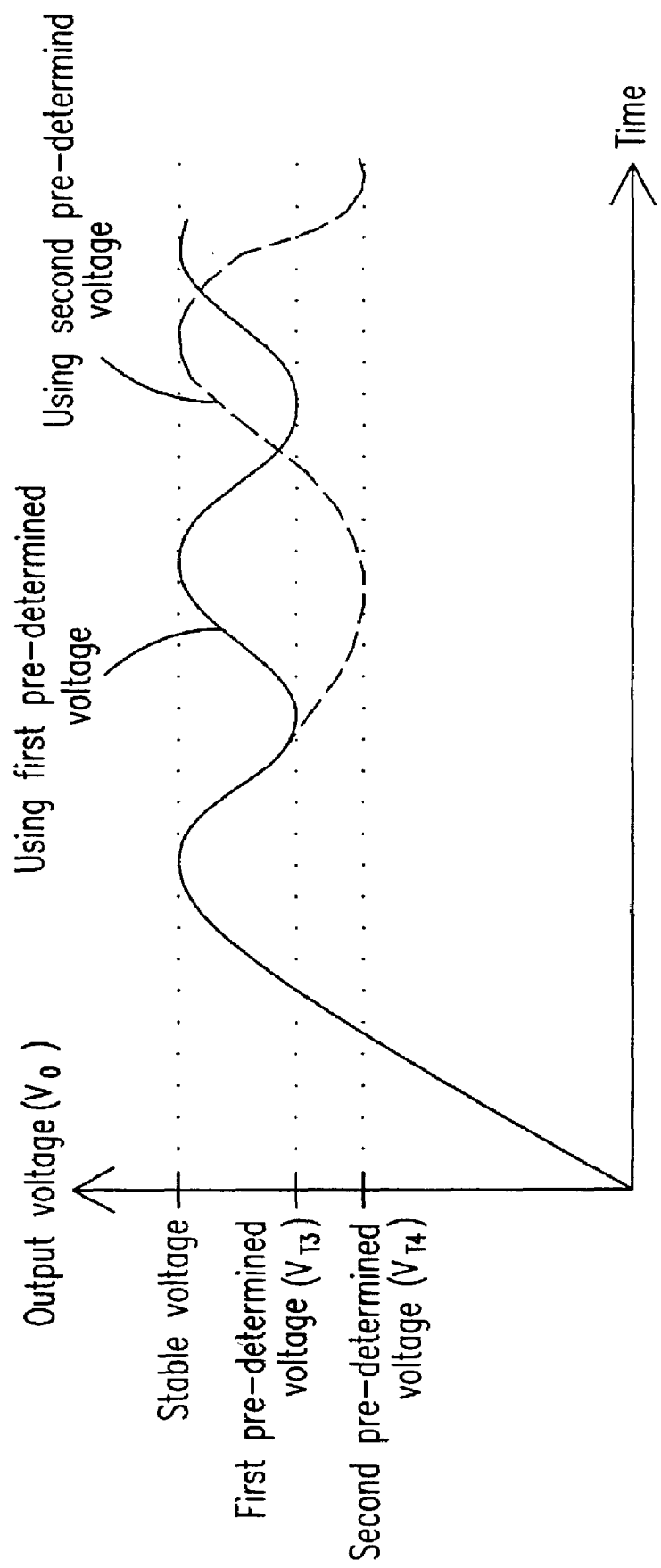
FIG. 5 is a plot showing the relative curves between the output voltages of the DC to DC converter and the time according to different pre-determined voltages.

Please refer to FIG. 5, which is a plot showing the relative curves between the output voltages of the DC to DC converter and the time according to different pre-determined voltages. The wireless communication system chooses among different output voltages according to the sensitivity needed by the receiver of the radio frequency to make the switching period of the switching signal $F_p$ changing according to the different requirements.

Surely, even if there is only a comparative circuit in the circuit configuration, still the wireless communication system not being interfered while receiving a signal is achieved.

In conclusion, the present invention would effectively improve the drawbacks of the prior art regarding the problem that the system being interfered by the magnetic field while receiving a signal at the radio frequency, and would control the switching period of the switching frequency signal $F_p$ according to the requirements of different systems. Thus, the present invention has its value in the industry, and the purpose of developing the present invention is achieved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A method for controlling a switching frequency signal used in a direct current to direct current (DC to DC) converter, wherein said DC to DC converter generates an output voltage to drive a system and said switching frequency signal is generated by inputting a modulation frequency to a pulse width modulation (PWM) circuit, comprising steps of:

generating a control signal from said system to stop said pulse width modulation (PWM) circuit to generate said switching frequency signal when a signal is received by said system; and restarting said pulse width modulation (PWM) circuit to generate said switching frequency signal in order to increase said output voltage to drive said system when said output voltage from said DC to DC converter is under a predetermined voltage.

2. The method according to claim 1 wherein said system is a wireless communication system.

3. The method according to claim 2 wherein said signal is received by a radio frequency (RF) receiver of said wireless communication system.

4. The method according to claim 1 wherein said switching frequency signal is used for switching a switch.

5. The method according to claim 4 wherein said switch is an N type metal-oxide-semiconductor transistor (NMOS).

6. The method according to claim 1 wherein said predetermined voltage is set by said system.

7. The method according to claim 1 wherein modulation frequency is a constant frequency.

8. A circuit for controlling a switching frequency signal used in a direct current to direct current (DC to DC) converter, wherein said DC to DC converter generates an output voltage to drive a system and said switching frequency signal is generated by inputting a modulation frequency to a pulse width modulation (PWM) circuit, comprising:
- a plurality of comparative circuits including a plurality of corresponding predetermined voltages for comparing said output voltage and said plurality of corresponding predetermined voltages when a signal is received by said system to stop said switching frequency signal and generating a plurality of output signals when said output voltage is smaller than said plurality of corresponding predetermined voltages; and
- a multiplexer electrically connected to said plurality of comparative circuits for determining one of said plurality of comparative circuits according to said system and transferring one of said plurality of output signals corresponding to said determined comparative circuit to said pulse width modulation (PWM) circuit for restarting said pulse width modulation (PWM) circuit to generate said switching frequency signal, thereby increasing said output voltage to drive said system.

9. The circuit according to claim 8 wherein said switching frequency signal is used for switching a switch.

10. The circuit according to claim 9 wherein said switch is an N type metal-oxide-semiconductor transistor (NMOS).

11. The circuit according to claim 8 wherein said system is a wireless communication system.

12. The circuit according to claim 11 wherein said signal is received by a radio frequency (RF) receiver of said wireless communication system.

13. A circuit for controlling a switching frequency signal used in a direct current to direct current (DC to DC) converter, wherein said DC to DC converter generates an output voltage to drive a system and said switching frequency signal is generated by inputting a modulation frequency to a pulse width modulation (PWM) circuit, comprising:
- a comparative circuit including a predetermined voltage for comparing said output voltage and said predetermined voltage when a signal is received by said system to stop said switching frequency signal and generating an output signal to said pulse width modulation (PWM) circuit for restarting said pulse width modulation (PWM) circuit to generate said switching frequency signal to increase said output voltage to drive said system when said output voltage is smaller than said predetermined voltage.

* * * * *